(12) United States Patent
Dierichs et al.

(10) Patent No.: US 7,113,261 B2
(45) Date of Patent: Sep. 26, 2006

(54) RADIATION SYSTEM, LITHOGRAPHIC APPARATUS, DEVICE MANUFACTURING METHOD AND DEVICE MANUFACTURED THEREBY

(75) Inventors: Marcel Mathijs Theodore Marie Dierichs, Venlo (NL); Markus Franciscus Antonius Eurlings, Tilburg (NL); Olav Waldemar Vladimir Frijns, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 38 days.

(21) Appl. No.: 10/862,819

(22) Filed: Jun. 8, 2004

(65) Prior Publication Data
US 2005/0270511 A1    Dec. 8, 2005

(51) Int. Cl.
*G03B 27/74*     (2006.01)
*G03B 27/68*     (2006.01)
*G03B 27/42*     (2006.01)
*G01B 11/00*     (2006.01)

(52) U.S. Cl. .............. 355/68; 355/52; 355/53; 356/400

(58) Field of Classification Search ............. 355/52, 355/53, 67, 68; 378/34; 356/399, 400
See application file for complete search history.

(56) References Cited

U.S. PATENT DOCUMENTS 6,081,320 A * 6/2000 Tanitsu ................... 355/71
6,842,500 B1 * 1/2005 Komatsuda et al. ......... 378/34

FOREIGN PATENT DOCUMENTS

| EP | 0 849 637 A2 | 6/1998 |
| EP | 0 987 601 A2 | 3/2000 |
| JP | 5-217844 | 8/1993 |
| WO | WO 2004/031854 A2 | 4/2004 |

* cited by examiner

*Primary Examiner*—Alan Mathews
(74) *Attorney, Agent, or Firm*—Pillsbury Winthrop Shaw Pittman, LLP

(57) ABSTRACT

A radiation system includes a radiation generator to generate radiation, a source, and an illumination system configured to receive the radiation and provide a beam of radiation. The illumination system includes a beam measuring system configured measure at least one of position and tilt of the beam of radiation relative to the illumination system and a projecting device configured to redirect only a part of a cross section of the beam of radiation to the beam measuring system. The beam measuring system may include several position sensors, the readouts of which can be used to determine incorrect alignment of the radiation source with respect to the illumination system. Diaphragms are connected to the collector of the radiation generator, so that in addition to X, Y, and Z corrections, Rx, Ry and Rz corrections are possible.

11 Claims, 7 Drawing Sheets

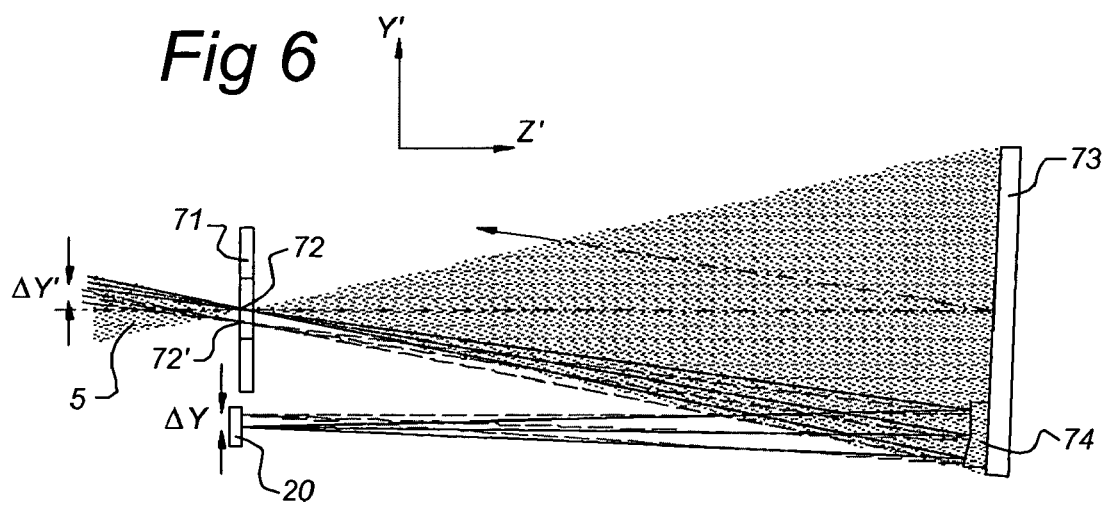
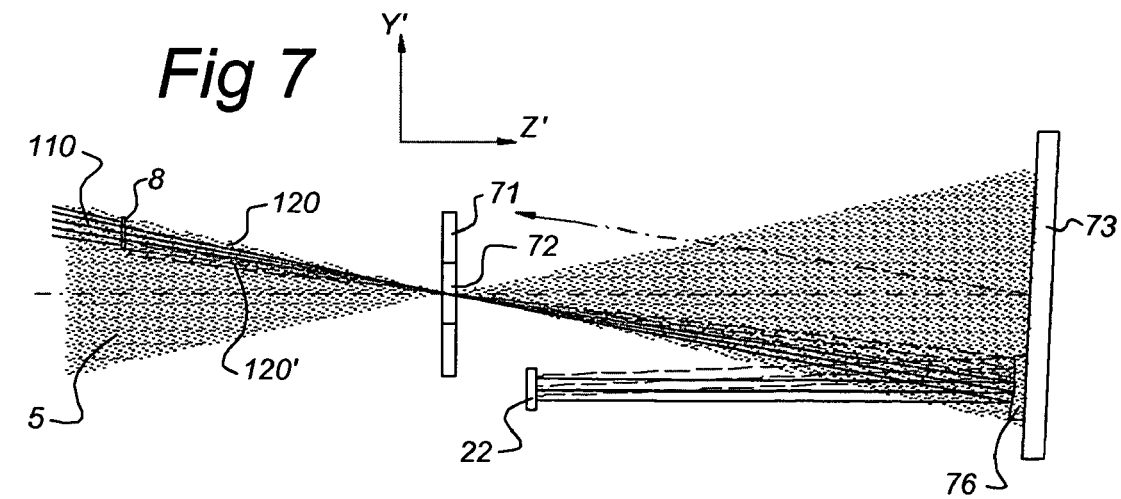

RADIATION SYSTEM, LITHOGRAPHIC APPARATUS, DEVICE MANUFACTURING METHOD AND DEVICE MANUFACTURED THEREBY

BACKGROUND OF THE INVENTION

1. Field of the Invention

The present invention relates to a radiation system, a lithographic apparatus including a radiation system, and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the radiation beam in a given direction (the "scanning" direction) while synchronously scanning the substrate parallel or anti-parallel to this direction.

A lithographic apparatus may include a radiation generator arranged to provide a radiation beam. The radiation generator is positioned relative to an illumination system that is arranged to process the beam and provide a projection beam. When the radiation generator is not correctly positioned, the radiation beam will enter the illumination system in an erroneous way. A zero sensor may be used arranged to measure the relative position of the radiation generator in 6 degrees of freedom (DoF). A zero sensor includes a laser and a corner cube that reflects the laser beam on to a detector. This type of measuring system provides accurate alignment if the laser and corner cube can be positioned close together and a small measurement range is needed. However, to align a radiation generator relative to an illumination system, such a zero sensor has either a measurement range or a measurement accuracy that does not meet the requirements.

In current DUV (deep ultra violet) and VUV (very ultra violet) systems the alignment of the position of a radiation generator with reference to an illumination system is done by measuring the position and/or tilt of the beam coming from the radiation generator with respect to the illumination system. In such radiation systems, a part of the radiation beam is directed to a beam measuring system by way of a mirror with a reflection coefficient of, for example 4%, and a transmission coefficient of, for example 95%, the residual intensity is lost due to absorption. The reflected part is processed by an optical system including lenses to project a focus spot or a demagnified image on a position sensor, such as CCD sensors, CMos, Quad Cells and PSD, referred to herein as "position sensors". Each position sensor is arranged to measure the near field or far field of the beam in two degrees of freedom. By using several position sensors, the position and tilt of the radiation beam can be determined in four degrees of freedom. Using a partly reflective mirror will result in a loss of radiation (i.e. energy) in the direction of the rest of the illumination system. Furthermore, such a partly reflecting mirror is not suitable for very short wavelengths in combination with the high radiation intensity used in EUV lithography systems.

SUMMARY OF THE INVENTION

It is an aspect of the present invention to provide a radiation system including a radiation generator and an illumination system wherein a relative position of the radiation generator with respect to the illumination system can be measured with a minimal loss of energy.

According to an aspect of the invention, a radiation system includes a radiation generator configured to generate a radiation beam, the radiation generator including a source; an illumination system configured to receive the radiation beam and provide a projection beam of radiation, the illumination system including a beam measuring system configured to measure a position and/or tilt of the radiation beam relative to the illumination system, and a projecting device configured to direct part of the radiation beam to the beam measuring system, wherein the part of the radiation beam is a part of a cross section of the radiation beam.

The part of the cross section may be chosen relatively small compared to the whole cross section of the radiation beam. Even a small part of a cross section contains information on the position of the radiation beam, which may be measured by a measuring system. By using only a part of the cross section of the radiation beam, only a small amount of energy is redirected for measuring purposes. According to the invention, the projecting device may include optical lenses or optical mirrors.

In an embodiment, the measuring system includes a first position sensor and the projecting device includes a first optical element configured to image the source onto the first position sensor. By imaging the source on an position sensor, the position of the beam of radiation in two degrees of freedom can be determined using readouts of the position sensor In another embodiment, the beam measuring system includes a second position sensor and the projecting device includes a second optical element configured to image the source onto the second position sensor. This embodiment allows determination of the relative position of the beam of radiation with respect to the illumination system in three degrees of freedom. This means that the relative position of the radiation generator can be determined with respect to the illumination system. This information may be used to correct their relative positions.

In yet another embodiment, the radiation generator includes a first diaphragm configured to pass radiation from a first peripheral part of a cross section of the beam of radiation, wherein the beam measuring system includes a first position sensor, and the projecting device includes a first optical element configured to receive radiation passed by the first diaphragm, and also configured to generate a far field image of the intermediate focus on the first position sensor.

Readouts of the first position sensor are indicative of a tilt of the radiation generator with respect to the illumination system. With one diaphragm and one position sensor, it is possible to measure tilting in two directions. If two diaphragms and two position sensors are used, it is possible to measure both Rx, Ry, Rz (i.e. a tilt in three degrees of freedom) and a Z-shift of the beam of radiation.

According to another aspect of the invention, a lithographic apparatus includes a radiation system as described above; a support configured to support a patterning device, the patterning device configured to impart the radiation beam with a pattern in its cross-section; a substrate table configured to hold a substrate; and a projection system configured to project the patterned beam onto a target portion of the substrate.

According to a further aspect of the invention, there is provided a device manufacturing method including providing a beam of radiation using a radiation system as described above; using a patterning device to impart the beam with a pattern in its cross-section; and projecting the patterned beam of radiation onto a target portion of a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

The support supports, e.g. bares the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as Encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 4b depicts a perspective view of the beam measuring system of FIG. 4a;

FIG. 6 depicts a side view of a position measurement according to an embodiment of the present invention;

FIG. 7 depicts a side view of a tilt measurement according to an embodiment of the present invention;

DETAILED DESCRIPTION

Figure 1:
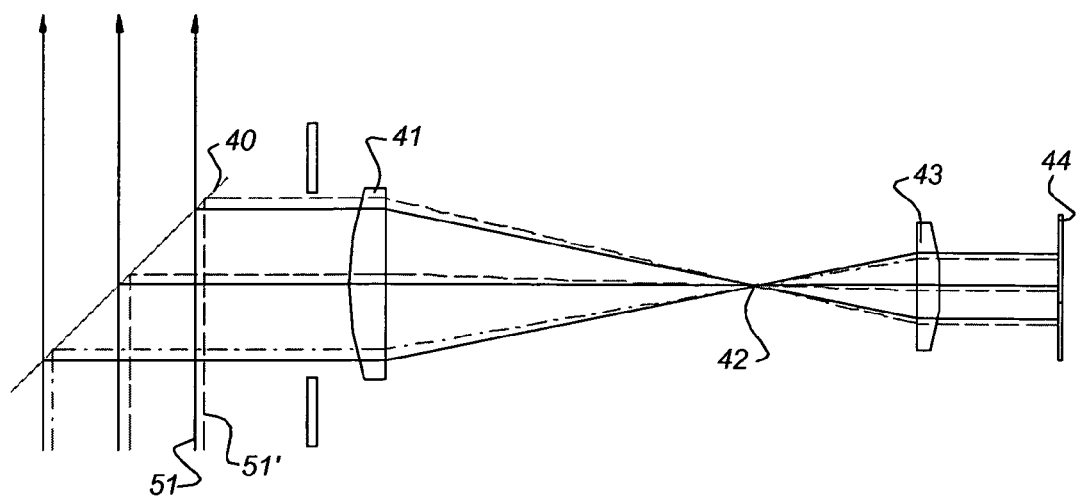
FIG. 1 depicts part of a beam measuring system measuring a change in position of a beam according to the prior art.

Referring to FIG. 1, a beam measuring system according to the prior art is fixed to an illumination system (not shown) and includes a partly transparent/partly reflective mirror 40 which is positioned in a beam of radiation 51 coming from a radiation generator (not shown). Three arrows in FIG. 1 indicate the radiation passing the mirror 40. Part of the radiation beam 51 is reflected to a lens 41. The lens 41 is configured to form an intermediate focus 42. A lens 43 is configured to receive radiation coming from the intermediate focus 42. The lens 43 is configured to form a demagnified image of beam 51 on a position sensor 44. The position sensor 44 is configured to detect the position of the beam 51 on the position sensor 44. When the radiation generator is incorrectly positioned with respect to the illuminator (i.e. measuring system) a radiation beam 51' will hit the mirror 40. Radiation from the beam 51' is indicated by dashed lines. The radiation from beam 51' will pass lens 41 differently than beam 51, as shown in FIG. 1. Radiation from beam 51' will go through intermediate focus 42 but will hit lens 43 with a different angle than radiation from beam 51. As can be seen in FIG. 1, radiation from beam 51' will form a spot on the position sensor 44 that is below the spot formed by radiation from beam 51. This means that position sensor 44 will register a different X,Y value for the radiation detected. This different value can be used to determine the change in position of the beam 51' with respect to beam 51. This change corresponds to a positioning error of the radiation generator relative to the illumination system. In this way, the beam measuring system can be used to align the radiation generator relative to the illumination system.

Figure 2:
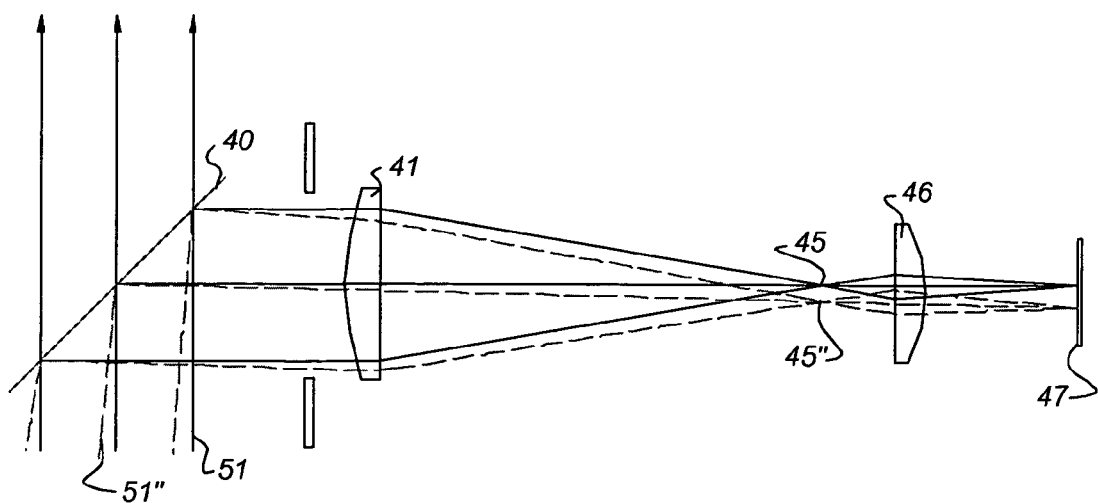
FIG. 2 depicts part of a beam measuring system measuring a change in tilt of a beam according to the prior art.

FIG. 2 shows an example of a tilt measurement. As shown in FIG. 1, the mirror 40 is configured so that radiation from beam 51 is focused in an intermediate focus 45. Radiation coming from the intermediate focus 45 is incident on a lens 46. The lens 46 is configured to image focus 45 on a position sensor 47. As shown in FIG. 2, a tilted beam 51" is incident on the mirror 40. Radiation from the tilted beam 51" is indicated by dashed lines. The radiation from the tilted beam 51" forms an intermediate focus 45" different from intermediate focus 45. After passing the intermediate focus 45", the radiation from the tilted beam 51" is incident on lens 46. The lens 46 projects the radiation from the tilted beam 51" onto the position sensor 47. The position sensor 47 detects this image in a different X,Y position than the image resulting from the beam 51. The change in position is a measure for the amount of tilt of the tilted beam 51" with respect to the beam 51.

With the beam measuring system according to the prior art, the change in position in two degrees of freedom can be measured. Furthermore, a measurement in change in tilt of the beam 51 in two degrees of freedom is possible. The mirror 40 may have a transmission coefficient of, for example 95%. Accordingly, 5% of the radiation coming from the radiation generator would be lost due to the position and/or tilt measurement.

Figure 3:
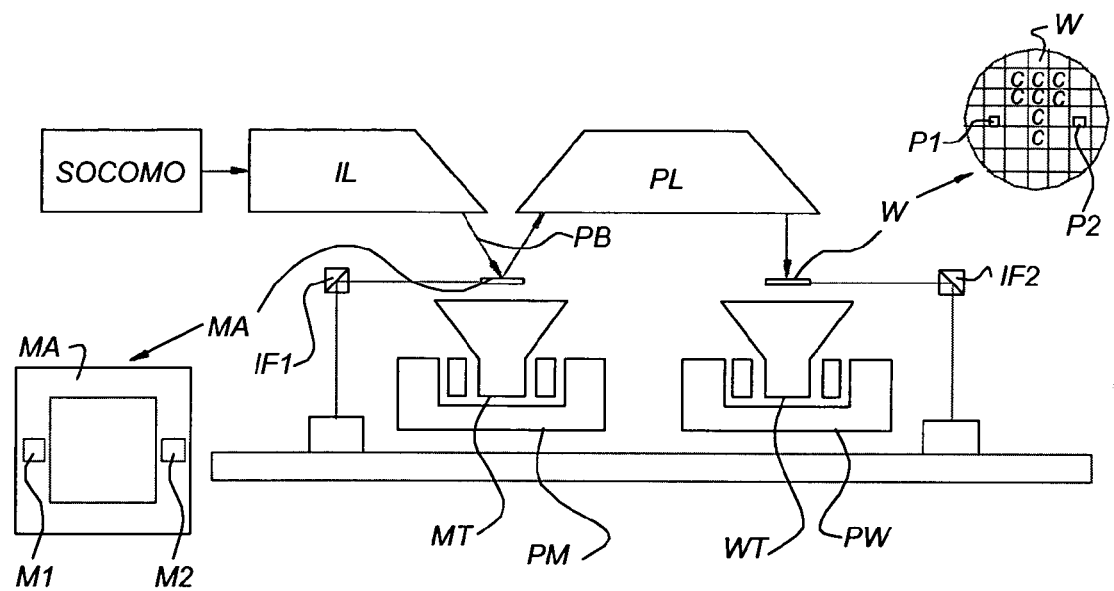
FIG. 3 depicts a lithographic apparatus according to an embodiment of the present invention.

FIG. 3 schematically depicts a lithographic apparatus according to an embodiment of the present invention. The apparatus includes a radiation system configured to provide a beam PB of radiation (e.g. UV or EUV radiation). A first support (e.g. a mask table) MT is configured to support a patterning device (e.g. a mask) MA and is connected to first positioning device PM that accurately positions the patterning device with respect to a projection system ("lens") PL. A substrate table (e.g. a wafer table) WT is configured to hold a substrate (e.g. a resist-coated wafer) W and is connected to second positioning device PW that accurately positions the substrate with respect to the projection system PL. The projection system (e.g. a reflective projection lens) PL is configured to image a pattern imparted to the beam PB by patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The radiation system includes a radiation generator SOCOMO (source collector module) and an illumination system ("illuminator") IL which receives a beam of radiation from the radiation generator SOCOMO. The radiation generator SOCOMO may include a collector CO, but in some embodiments, it only includes a source SO.

The illuminator IL may include an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, PB, having a desired uniformity and intensity distribution in its cross-section.

The beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:
1. In step mode, the mask table MT and the substrate table WT are kept essentially stationary, while an entire pattern imparted to the beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above. Combinations and/or variations on the above described modes of use or entirely different modes of use may also be employed.

Figure 4A:
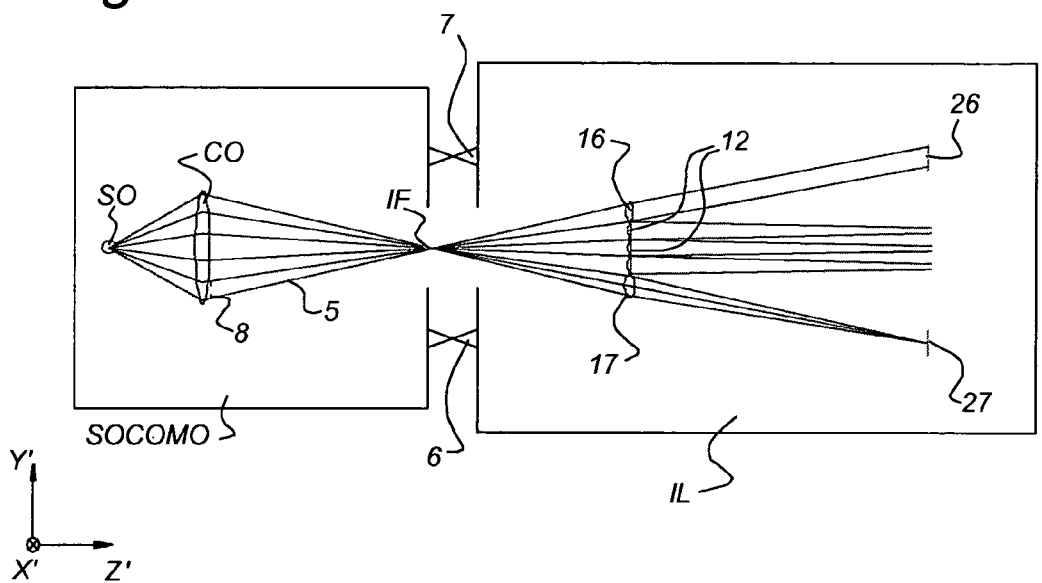
FIG. 4a depicts a cross section of a part of a radiation system according to an embodiment of the present invention.

Referring to FIG. 4a, the source SO and the collector CO and the illumination system IL are shown. The source SO and collector CO are arranged in the radiation generator SOCOMO to generate a beam of radiation 5. The radiation generator SOCOMO is positioned relative to the illumination system IL by positioning devices 6, 7. The illumination system IL is positioned relative to the radiation generator SOCOMO so as to receive the beam of radiation 5 correctly. The beam of radiation 5 is processed in the illumination system IL and transmitted as a beam of radiation to the rest of the lithographic apparatus. As shown in FIG. 4a, the collector CO is arranged to generate an intermediate focus IF between the radiation generator SOCOMO and the illumination system IL. In the illumination system IL, the beam of radiation 5 is projected on field lenslets 12 which transmit the radiation further to pupil lenslets (not shown). As shown in FIG. 4a, the collector CO and the field lenslets are lenses. However, in practice they may be mirrors performing the same optical function. Then the field lenslets 12 are substituted by field facets. Similarly, then, the pupil lenslets (not shown) are substituted by pupil facets.

Figure 4B:
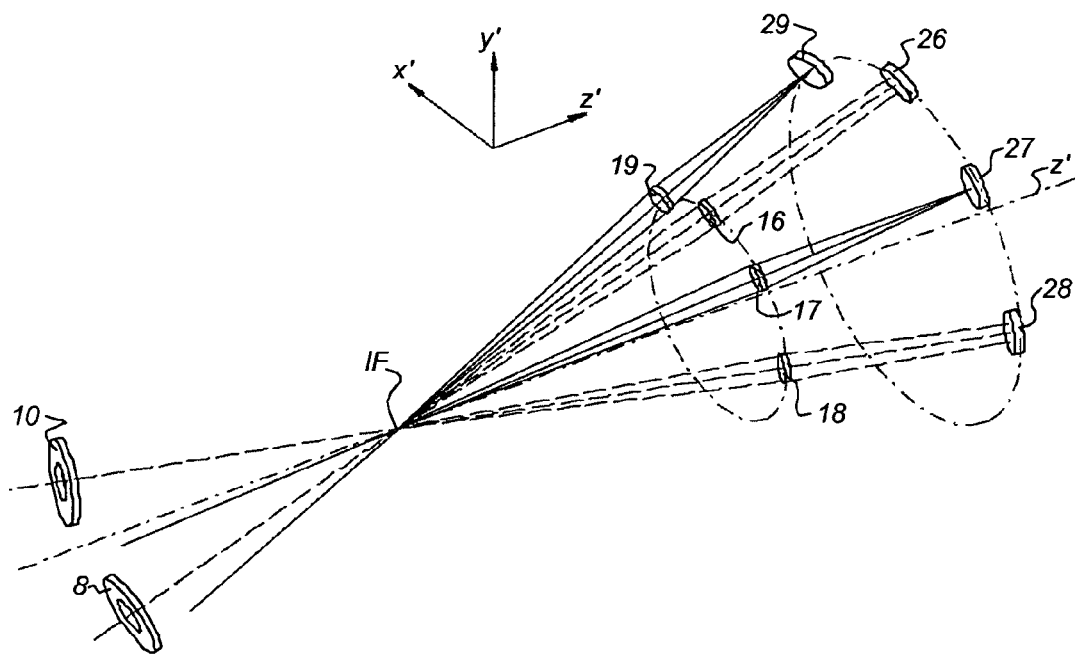

The illumination system IL includes a beam measuring system configured to measure a position and/or tilt of the beam of radiation 5 relative to the illumination system IL. In an embodiment, the measuring system includes four position sensors. Only two position sensors 26, 27 are shown in FIG. 4a. FIG. 4b is a perspective view of part of the embodiment. Referring to FIG. 4b, a third position sensor 28 and a fourth position sensor 29 are shown. The position sensors 26, 27, 28, 29 are arranged to detect the position of an incident beam of radiation on their surfaces. In FIG. 4b, the sensors 26, 27, 28, 29 are positioned on a circle in a plane perpendicular to the Z'-axis. It should be appreciated that other arrangements are possible. In this embodiment, next to the field lenslets 12, four lenses 16, 17, 18, 19 are arranged to redirect several parts of the beam of radiation 5 to the position sensors 26, 27, 28, 29, as shown in FIG. 4b. Preferably, small parts at the periphery of the beam of radiation 5 are redirected.

The function of the position sensors 26, 27, 28, 29 will be discussed in more detail. Radiation coming from the intermediate focus IF is projected by lenses 16, 18 onto the position sensors 26, 28 respectively. The lenses 17, 19 are arranged to focus radiation coming from the intermediate focus IF onto the position sensors 27, 29 respectively. The lenses 16, 18 are arranged so that they generate a far field image of the intermediate focus IF or an image of the diaphragms 8 and 10 on the position sensors 26, 28. A processor (not shown) arranged to receive signals from the position sensors 26, 27, 28, 29 may be used to detect correct and incorrect alignment of the beam of radiation 5 relative to the illumination system IL. If the processor detects an incorrect alignment of the beam of radiation 5, it means that radiation generator SOCOMO is incorrectly positioned relative to the illumination system IL. Using output from the position sensors 26, 28 the processor is able to detect a tilt of the radiation beam 5.

The radiation generator SOCOMO includes diaphragms 8 and 10, arranged to pass radiation from a peripheral part of a cross section of the beam of radiation 5. In FIG. 4b, both diaphragms 8, 10 are shown. The lens 16 is configured to receive radiation from diaphragm 8 and lens 18 is configured to receive radiation from diaphragm 10. The diaphragms 8, 10 are configured such that they are fixed relative to the radiation generator SOCOMO. By using a diaphragm a virtual radiation source is created. Light from the diaphragm 8 is projected by the lens 16 onto position sensor 26.

When the beam of radiation 5 is shifted relative to the illumination system IL, the radiation reaching the lenses 16, 17, 18, 19 changes. As a result, the beams reaching the position sensors 26, 27, 28, 29 change. The changes are reflected by the signals generated by sensors 26, 27, 28, 29 which can be used by the processor for correcting errors in shift and/or tilt of the radiation generator SOCOMO with respect to the illumination system IL.

Figure 5A:
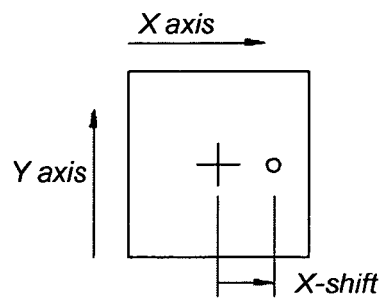
FIGS. 5a–5g depict examples of sensor readouts according to the present invention.
Figure 5B:
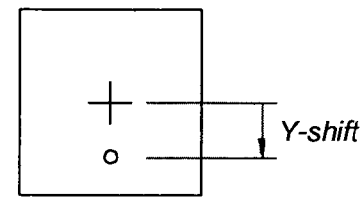

In FIGS. 5a–5g some examples of readouts of the position sensors 26, 27, 28, 29 are shown. FIGS. 5a and 5b show a square representing a front surface of position sensor 27 on which a focused spot of the beam is incident. A cross at the middle of the square depicts an origin indicating a position of the beam impinging on position sensor 27 in which the beam of radiation 5 (and thus the radiation generator SOCOMO) is not shifted relative to the illumination system IL compared to a desired configuration. In FIG. 5a, the detected spot is shifted in the X-direction on the position sensor 27. An X-shift on the position sensor 27 may correspond to an X'-shift, as shown in FIG. 4a, of the radiation generator SOCOMO with respect to the illumination system IL. FIG. 5b shows a pure Y-shift on the position sensor 27, corresponding to a Y'-shift of the radiation generator SOCOMO, wherein Y' is perpendicular to X', as shown in FIG. 4a. In FIG. 4a a Z'-direction is defined as being the direction of the propagation of the radiation into the illumination system IL.

If both an X-shift and a Y-shift are detected on the position sensor 27, the radiation generator SOCOMO is incorrectly aligned in both an X' and a Y'-direction with respect to the illumination system IL.

Figure 5C:
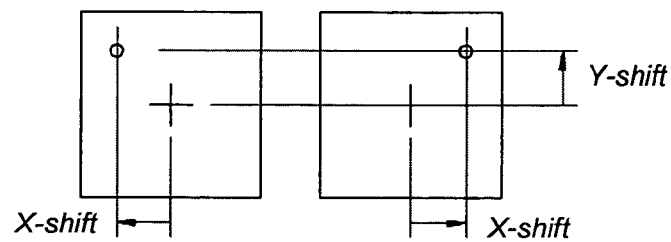

FIG. 5c shows two readouts. The first readout is read by position sensor 27 and the second readout is coming from position sensor 29. In an embodiment, the processor is arranged to detect a shift in both X,'Y' and Z' using signals from the two position sensors 27, 29.

Figure 5D:
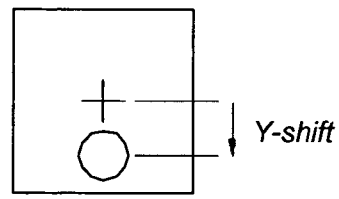
Figure 5E:
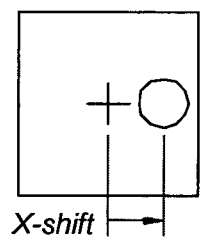

In FIGS. 5d–5g some examples of readouts of the position sensors 26, 28 are shown. In FIG. 5d, a readout of sensor 26 (or sensor 28) showing an Y-shift spot below the origin indicates that the beam of radiation 5 is tilted in one direction with respect to the illumination system IL. This means that the diaphragm 8 (or diaphragm 10), and thus the radiation generator SOCOMO, is tilted with respect to the illumination system IL in, for example, the X'-direction. A tilt around the X'-axis is indicated by Rx. FIG. 5e shows a readout of sensors 26 (or sensor 28) wherein the image spot is to the right of the origin. This means that there is a tilt around the Y'-axis, indicated by Ry. Due to the fact that sensors 26, 28 receive radiation coming from the diaphragms 8, 10, and these diaphragms 8, 10 are attached to the radiation generator SOCOMO, the position sensors 26, 28 function as 'tilt sensors'.

Figure 5F:
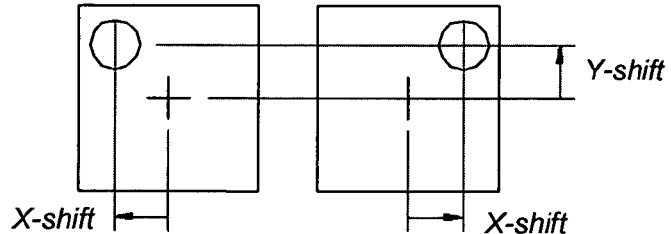

FIG. 5f shows two readouts in which the first position sensor 26 detects a spot in the fourth quadrant and the second position sensor 28 detects a spot in the first quadrant. On both position sensors 26, 28 the X-shift and the Y-shift are equal. Such a situation indicates a Z'-shift of the beam of radiation 5, wherein the Z'-direction is the propagation direction of the beam of radiation 5 between the radiation generator SOCOMO and the illumination system IL. Such a Z'-shift of the radiation beam 5 can not be measured by a beam measuring system of the prior art. Measuring such a Z'-shift is especially important when using a radiation system with an intermediate focus between the radiation generator SOCOMO and the illumination system IL.

Figure 5G:
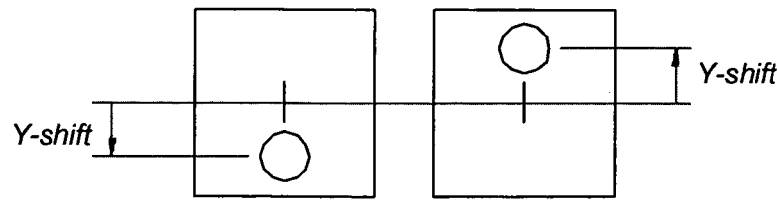

In FIG. 5g two readouts are shown wherein the first position sensor detects a negative Y-shift and the second position sensor detects a positive Y-shift. This readouts are indicative for a tilt of the beam of radiation 5 around the Z'-axis. Detecting a tilt around the Z'-axis may be useful if the beam of radiation 5 is not line symmetrical. A tilt around the Z'-axis will then cause erroneous processing of the radiation 5 by the illumination system IL.

It should be noted that the readout of the sensors depend on the optical configuration, i.e. position of the mirrors and sensors with respect to the beam. Therefore, with a different optical scheme the sensor readout will also be different.

FIG. 6 shows a side view of a position measuring system in a radiation system configured for radiation with small wavelength, for example EUV radiation. A beam of radiation 5 has an intermediate focus 72 and passes through an aperture 71. A cross section of the beam of radiation 5 along the propagation direction is indicated by a grey area. The beam of radiation 5 is incident on a field facet mirror frame 73. A reflective optical element 74, for example a mirror, is on the field facet mirror frame 73. The element 74 receives part of the beam of radiation 5, depicted as solid lines as shown in FIG. 6. The element 74 projects the part onto the position sensor 20 which is configured to detect a change in X,Y position of intermediate focus 72. When the beam of radiation 5 is shifted in the negative Y'-direction, a shifted intermediate focus 72' of the shifted beam of radiation will be located just below the intermediate focus 72, as shown in FIG. 6. The element 74 receives part of the shifted beam of radiation, depicted as dashed lines, see FIG. 6. The shifted intermediate focus 72' is imaged by element 74 onto position sensor 20 above the position of the image of the nonshifted intermediate focus 72. In this way, a position change ΔY' of the beam of radiation 5 is detected as a ΔY-shift on the position sensor, as shown in FIG. 6.

FIG. 7 shows a measurement of a tilt of the beam of radiation 5. A part 110 of the beam of radiation 5 is incident on the diaphragm 8. The diaphragm 8 only passes part of the radiation, indicated by solid lines 120. This part 120 is projected onto a reflective optical element 76, for example a mirror, mounted on field facet mirror frame 73. The element 76 is arranged to image the far field of intermediate focus 72 onto the position sensor 22. When the radiation generator SOCOMO is tilted with reference to the illumination system IL, and thus with reference to the measuring system, in for example the Y'-direction, the beam of radiation 5 is also tilted in the Y'-direction with reference to the illumination system IL, and thus with reference to element 76, as shown in FIG. 7. In the shifted situation, the element 76 will receive and project the radiation indicated by dashed lines 120', as shown in FIG. 7. The position sensor 22 will detect a spot that is shifted in the Y-direction on the position sensor 22. In this way, using a diaphragm 8 and projecting the far field of intermediate focus 12 onto sensor 22, a shift detection is possible. As was explained with respect to FIGS. 5d, 5e and 5g, two position sensors 26, 28 are needed to derive the X', Y' and Z' tilts of the beam of radiation 5 with reference to the illumination system IL. The elements 74, 76 may be mirrors including multiple layers. A multilayer mirror is suitable to reduce the out of band radiation, i.e. everything that is not within a predetermined bandwidth, ranging from EUV to infrared radiation.

Figure 8A:
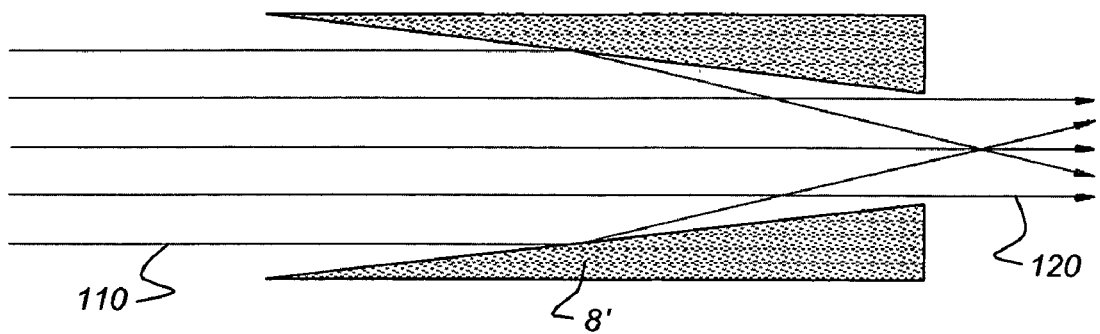
FIGS. 8a and 8b depict two embodiments of a diaphragm according to the present invention.
Figure 8B:
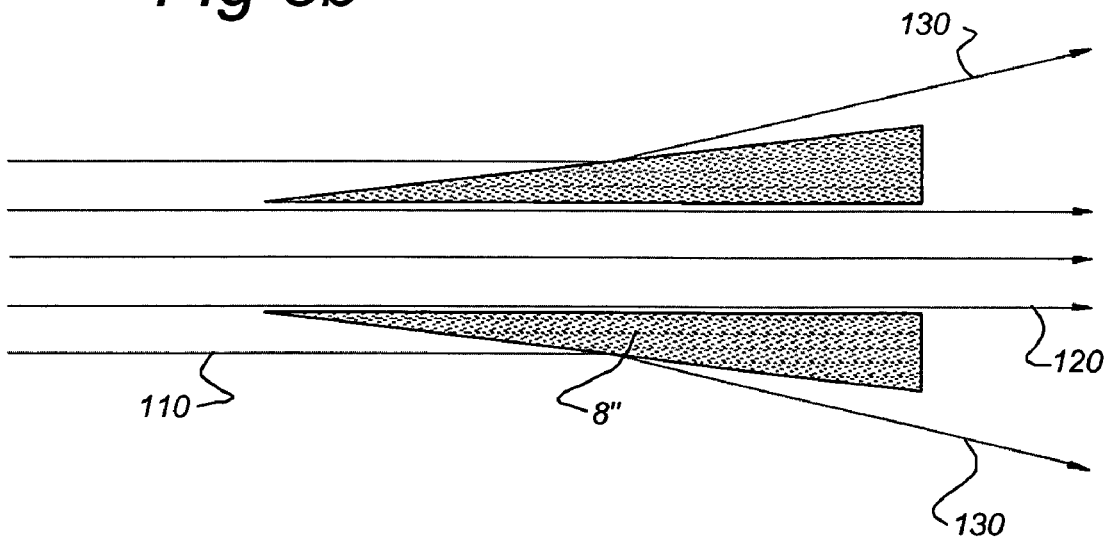

The diaphragms 8, 10 may be conical incidence mirrors. Radiation hitting the diaphragms 8, 10 will partly reflect on the surfaces of the conical mirrors. In this way, the radiation will not heat up the diaphragms 8, 10 too much. FIG. 8a shows a possible embodiment of the diaphragm according to the present invention. In FIG. 8a, a longitudinal cross-section of a diaphragm 8' is shown. The diaphragm 8' is formed by an inner wall which is a conical mirror which has a cross-section that decreases in the direction of the exit of the diaphragm 8'. In FIG. 8a, the radiation 120 passing the diaphragm 8' is indicated by arrows. The light that is reflected from the conical surface creates a kind of point source that could be used to detect the tilt of the SOCOMO. FIG. 8b shows another embodiment of the diaphragm 8" formed by a tube having an outer wall which is a conical mirror. Radiation hitting the outer wall, i.e. the mirror, will be directed in a direction indicated by arrows 130. The light that is reflected will be absorbed in other parts of the collector.

Figure 9C:
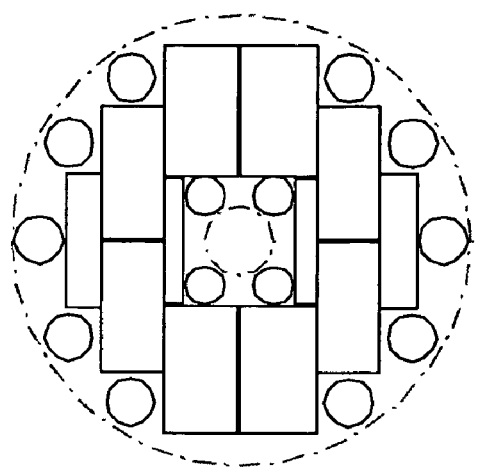
FIG. 9c depicts possible positions of optical mirrors according to the present invention.
Figure 9B:
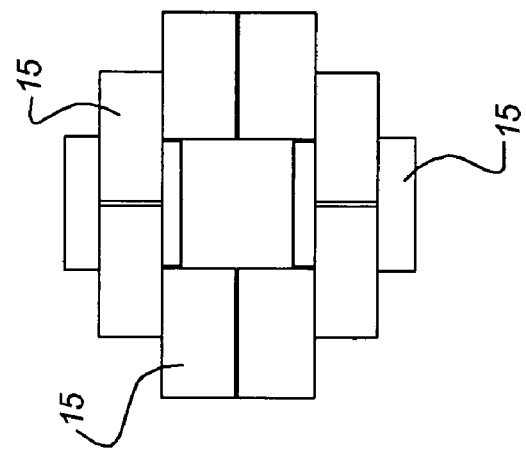
FIG. 9b depicts a front view of field facets in an EUV lithographic apparatus according to the present invention.
Figure 9A:
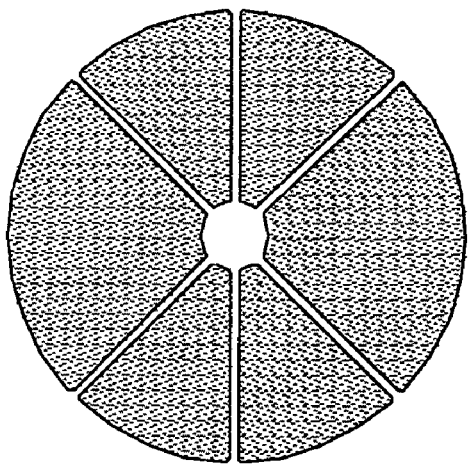
FIG. 9a depicts a cross section of an EUV radiation beam at the field facets according to the present invention.

According to an embodiment, the illumination system IL includes a plurality of field facet mirrors arranged to focus specific parts of the beam of radiation 5, for example as described in U.S. Pat. No. 6,438,199, incorporated herein by reference. The projecting device includes optical elements 74, 76, for example mirrors, that are additional reflective elements located adjacent to those field facet mirrors and configured to redirect a part of the beam of radiation 5 other than those specific parts. FIG. 9a shows an EUV distribution in the illumination system IL far from the intermediate focus IF, e.g. at a surface in which these field facet mirrors are located, i.e. the field facet mirror frame 73. In FIG. 9b, a front view of the field facet mirrors 15 in the illumination system IL is shown. Combining FIGS. 9a and 9b results in a distribution of the EUV radiation on the field facet mirrors 15 shown in FIG. 9c. Possible positions for the elements 74, 76 are also shown, indicated by circles, in FIG. 9c. Due to the configuration of the field facet mirrors 15, specific parts of the beam of radiation 5 are not incident on the field facet mirrors 15. This means that part of the radiation is actually not used. According to the invention, these specific parts are redirected by the optical elements 74, 76. This means that wasted radiation is used to measure the position and/or tilt of the radiation generator SOCOMO with respect to the illumination system IL.

While specific embodiments of the present invention have been described above, it should be appreciated that the present invention may be practiced otherwise than as described. For example, instead of projecting radiation directly onto a position sensor, a fluorescent plate and an extra lens can be inserted to convert, for example, EUV radiation into visible light, which can then be detected by a less expensive position sensor. The description is not intended to limit the present invention.

What is claimed is:

1. A radiation system, comprising:
a radiation generator configured to generate radiation, the radiation generator comprising a radiation source; and
an illumination system configured to receive the radiation and provide a beam of radiation, the illumination system comprising
a beam measuring system configured to measure at least one of position and tilt of the beam of radiation relative to the illumination system; and
a projecting device arranged to direct part of the beam of radiation to the beam measuring system wherein the part of the beam of radiation is a part of a cross section of the beam of radiation, wherein
the radiation generator further comprises
a collector configured to collect the radiation from the source and to form an intermediate focus in the radiation between the radiation generator and the illumination system;
a first diaphragm configured to pass the radiation from a first peripheral part of a cross section of the radiation; and
a second diaphragm configured to the pass radiation from a second peripheral part of a cross section of the radiation;
the beam measuring system further comprises
a first position sensor; and
a second position sensor; and
the projecting device further comprises
a first optical element configured to receive the radiation passed by the first diaphragm and to generate a far field image of the intermediate focus on the first position sensor; and
a second optical element configured to receive the radiation passed by the second diaphragm and to generate a far field image of the intermediate focus on the second position sensor.

2. A radiation system according to claim 1, wherein the first diaphragm is a conical incidence mirror.

3. A radiation system according to claim 1, wherein the first and second optical elements each comprise a mirror configured to reflect EUV radiation.

4. A radiation system according to claim 3, wherein the mirror comprises multiple layers.

5. A radiation system according to claim 1, wherein the illumination system comprises a facet mirror configured to focus specific parts of the radiation beam and the projecting device is configured to redirect a part of the radiation beam other than the specific parts.

6. A lithographic apparatus, comprising:
(a) a radiation system, the radiation system comprising:
a radiation generator configured to generate radiation, the radiation generator comprising a radiation source; and
an illumination system configured to receive the radiation and provide a beam of radiation, the illumination system comprising:
a beam measuring system configured to measure at least one of position and tilt of the beam of radiation relative to the illumination system; and
a projecting device arranged to direct part of the beam of radiation to the beam measuring system wherein the part of the beam of radiation is a part of a cross section of the beam of radiation
(b) a support configured to support a patterning device, the patterning device configured to impart the projection beam with a pattern in its cross section;
(c) a substrate table configured to hold a substrate, and
(d) a projection system configured to project the patterned beam onto a target portion of the substrate, wherein
the radiation generator further comprises
a collector configured to collect the radiation from the source and to form an intermediate focus in the radiation between the radiation generator and the illumination system;
a first diaphragm configured to pass the radiation from a first peripheral part of a cross section of the radiation; and
a second diaphragm configured to the pass radiation from a second peripheral part of a cross section of the radiation;
the beam measuring system further comprises
a first position sensor; and
a second position sensor; and the projecting device further comprises
a first optical element configured to receive the radiation passed by the first diaphragm and to generate a far field image of the intermediate focus on the first position sensor; and
a second optical element configured to receive the radiation passed by the second diaphragm and to generate a far field image of the intermediate focus on the second position sensor.

7. A lithographic apparatus according to claim 6, wherein the first and second diaphragms are conical incidence mirrors.

8. A lithographic apparatus according to claim 6, wherein the first and second optical elements each comprise a mirror configured to reflect EUV radiation.

9. A lithographic apparatus to claim 8, wherein the mirror comprises multiple layers.

10. A lithographic apparatus according to claim 6, wherein the illumination system comprises a facet mirror configured to focus specific parts of the radiation beam and the projecting device is configured to redirect a part of the radiation beam other than the specific parts.

11. A device manufacturing method, comprising:
generating radiation with a radiation source;
collecting the radiation from the source and forming an intermediate focus in the radiation between the radiation source and an illumination system;
receiving the radiation and providing a beam of radiation using the illumination system;
using the illumination system to direct a part of a cross section of the beam of radiation;
measuring the redirected part of the cross section of the beam of radiation to determine at least one of position and tilt of the beam of radiation relative to the illumination system by passing a first peripheral part of a cross section of the radiation through a first diaphragm and projecting the radiation passed by the first diaphragm with a first optical element to generate a far field image of the intermediate focus on a first position sensor and passing a second peripheral part of a cross section of the radiation through a second diaphragm and projecting the radiation passed by the second diaphragm with a second optical element to generate a far field image of the intermediate focus on a second position sensor;
imparting the beam of radiation with a pattern in its cross-section; and
projecting the patterned beam of radiation onto a target portion of a substrate.

* * * * *

UNITED STATES PATENT AND TRADEMARK OFFICE
CERTIFICATE OF CORRECTION

| | | |
|---|---|---|
| PATENT NO. | : 7,113,261 B2 | Page 1 of 1 |
| APPLICATION NO. | : 10/862819 | |
| DATED | : September 26, 2006 | |
| INVENTOR(S) | : Marcel Mathijs Theodore Marie Dierichs et al. | |

It is certified that error appears in the above-identified patent and that said Letters Patent is hereby corrected as shown below:

On title page, item 75 Inventors
please add inventor --HARM-JAN VOORMA, Zaltbommel (NL)--

Signed and Sealed this

Twenty-third Day of June, 2009

JOHN DOLL
*Acting Director of the United States Patent and Trademark Office*